United States Patent
Hoch et al.

(10) Patent No.: US 9,847,812 B2
(45) Date of Patent: Dec. 19, 2017

(54) METHOD FOR THE CONTACTLESS TAPPING OF COMMUNICATION SIGNALS

(71) Applicant: IFM ELECTRONIC GMBH, Essen (DE)

(72) Inventors: Werner Hoch, Tettnang (DE); Alfred Wagner, Bodnegg (DE)

(73) Assignee: IFM ELECTRONIC GMBH, Essen (DE)

( * ) Notice: Subject to any disclaimer, the term of this patent is extended or adjusted under 35 U.S.C. 154(b) by 0 days.

(21) Appl. No.: 15/523,099

(22) PCT Filed: Nov. 6, 2015

(86) PCT No.: PCT/EP2015/075878
§ 371 (c)(1),
(2) Date: Apr. 28, 2017

(87) PCT Pub. No.: WO2016/071480
PCT Pub. Date: May 12, 2016

(65) Prior Publication Data
US 2017/0317716 A1    Nov. 2, 2017

(30) Foreign Application Priority Data

Nov. 7, 2014    (DE) .................. 10 2014 222 803

(51) Int. Cl.
*H04B 3/46*    (2015.01)
*H04B 5/00*    (2006.01)
(Continued)

(52) U.S. Cl.
CPC ........... *H04B 3/46* (2013.01); *G01R 27/2605* (2013.01); *G01R 31/312* (2013.01); *H04B 5/0012* (2013.01)

(58) Field of Classification Search
CPC .... H04B 3/46; H04B 5/0012; G01R 27/2605; G01R 31/312
See application file for complete search history.

(56) References Cited

U.S. PATENT DOCUMENTS

| | | | | |
|---|---|---|---|---|
| 2010/0148762 A1* | 6/2010 | Imhof | ............... | G01D 5/145 324/207.13 |
| 2010/0262139 A1* | 10/2010 | Beller | ............... | A61B 18/1206 606/41 |
| 2011/0154207 A1 | 6/2011 | Begingfield, Sr. | | |
| 2013/0293218 A1* | 11/2013 | Levesque | ............... | G01R 15/22 324/96 |
| 2016/0003871 A1* | 1/2016 | Tourin-Lebret | ........ | G01R 15/06 324/126 |

FOREIGN PATENT DOCUMENTS

| | | |
|---|---|---|
| CN | 202177680 | 3/2012 |
| DE | 102013201458 | 7/2014 |

(Continued)

OTHER PUBLICATIONS

Yamabuki et al., Developement of Contactless Measuring Method of Transient Voltage on Cable Sheath, IEEE, 2000, pp. 1558-1563.*

(Continued)

*Primary Examiner* — Freshteh N Aghdam
(74) *Attorney, Agent, or Firm* — Bond Schoeneck & King, PLLC; George McGuire

(57) ABSTRACT

The invention relates to a method for the contactless tapping of communication signals that are exchanged between two communication units, in particular a sensor or actuator and a digital evaluating or control unit, wherein the communication signals are transmitted on a line (2) of a multi-core cable (1) as voltage signals. According to the invention, in order that the communication signals can be tapped also in the case of multi-core cables without the line having to be interrupted for this purpose, the communication signals are tapped capacitively, wherein at least two electrodes (10*a*, 10*b*), which lie on the cable sheath and the angular position of which in relation to the cable axis is variable, are used for the tapping and the angular position at which the differential (Continued)

signal between the two electrodes (10*a*, 10*b*) is maximized is determined, wherein the at least two electrodes (10*a*, 10*b*), each consisting of a plurality of individual electrodes (E1-E8), are designed as collection electrodes and the various angular positions of the collection electrodes (10*a*, 10*b*) are achieved in that the association of the individual electrodes (E1-E8) with the at least two collection electrodes (10*a*, 10*b*) is sequentially changed by means of a controller (26). The invention further relates to an assembly for performing said method.

5 Claims, 2 Drawing Sheets

(51) Int. Cl.
  *G01R 31/312*  (2006.01)
  *G01R 27/26*  (2006.01)

(56) References Cited

FOREIGN PATENT DOCUMENTS

| WO | 2011154207 | 12/2011 |
| WO | 2015010973 | 1/2015 |

OTHER PUBLICATIONS

K. Yamabuki; N. Nagaoka and A. Ametani: Development of Contactless Measuring Method of Transient Voltage. In: Power Engineering Society Winter Meeting, 2000. IEEE, vol. 3, 2000, 1558-1563. [0-7803-5935-6/00$10.00 (c) 2000 IEEE].

International Search Report, International Application No. PCT/ep2015/075878, pp. 1-17, International Filing Date Nov. 6, 2015, dated Jan. 5, 2016.

\* cited by examiner

METHOD FOR THE CONTACTLESS TAPPING OF COMMUNICATION SIGNALS

CROSS-REFERENCE TO RELATED APPLICATION

This application is the U.S. National Stage filing under 35 U.S.C. 371 of international application number PCT/EP2015/075878, filed on Nov. 6, 2015, which claims priority to German Application No. 10 2014 222 803.4, filed Nov. 7, 2014, the entire disclosure of each of which is incorporated herein by reference.

BACKGROUND OF THE INVENTION

The invention relates on the one hand to a method for contactless tapping of communication signals that are exchanged between two communication units, wherein the communication signals are transmitted as voltage signals on a line of a multi-core cable. The two communication units are in particular a sensor on the one hand and an actuator and a digital evaluation or control unit on the other hand. Furthermore, the invention relates to an assembly for performing such a method.

In the practice of automation technology there is a continuous demand to "wiretap" the data traffic on a signal line, for example for analyzing the communication between the master and a slave of a fieldbus system. A separation of the signal line at the corresponding point here is usually not desirable, because that would be associated with an at least temporary shutdown of the plant. In the prior art, current clamps and the like are known, i.e. a clamp-like tool, which engages around the cable and detects the signals according to the transformer principle without the need to interrupt the signal line. However, in the case of a multi-core cable in which the single line cannot be separated and thus be gripped, the tap is no longer possible in this manner or the detected signals are so weak that a reconstruction of the original signals yields no satisfactory result. Incidentally, in this way only current levels and no voltage signals can be detected.

It is the object of the invention to be able to tap the voltage signals even in multi-core cables without having to interrupt the line.

SUMMARY OF THE INVENTION

This object is achieved according to the invention by a method according to claim 1 and an assembly according to claim. 4

According to the invention the communication signals are tapped capacitively, wherein at least two electrodes are used for tapping which abut on the cable sheath and whose angular position with respect to the cable axis is variable. For this purpose, for example, a clamp-like tool can come into consideration, in which the electrodes are arranged side by side along the inner circumference. The at least two electrodes are each formed of a plurality of individual electrodes and configured as collector electrodes. It is essential to sequentially change respectively the allocation of the individual electrodes to the at least two collector electrodes by means of a controller such that different angular positions of the collector electrodes can be realized. Finally, the one angular position is determined at which the differential signal between the at least two collector electrodes is maximum. In this position the voltage signal transmitted on the signal line can be tapped via the collector electrodes and be reconstructed.

The change of allocation of the individual electrodes to the at least two collector electrodes in an advantageous implementation of the invention is carried out in a multiplexer to which the individual electrodes are interconnected and which is controlled by the controller. Alternatively, the change of allocation of the individual electrodes to the at least two collector electrodes can be implemented in a logic unit to which the individual electrodes are connected and which is controlled by the controller.

BRIEF DESCRIPTION OF THE DRAWINGS

Hereinafter the invention is explained in more detail with reference to drawings and based on exemplary embodiments. In the drawings.

DETAILED DESCRIPTION OF EMBODIMENTS

In the figures, unless otherwise stated, like numerals denote like parts with the same meaning.

Figure 1A:
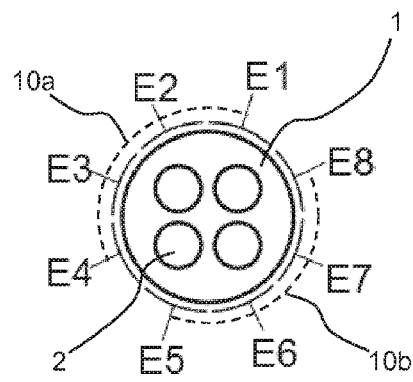
FIG. 1a/1b respectively show a cross-section of a multi-core cable which is clasped by a tool for contactless tapping of communication signals.
Figure 1B:
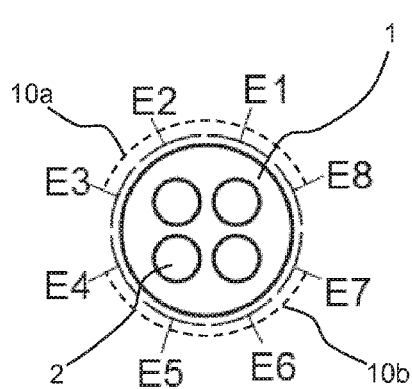

FIGS. 1a and 1b respectively show the cross section of a multi-core cable 1. Here, a typical industrial application as a four-wire control cable with stranding is shown. Typically, the cable has a diameter of about 5 mm, and is sheathed with PUR or PVC. The four cores are typically two supply lines, one for the analogue process value and one for the communication. By use of this cable two communication units are connected to each other, wherein the one communication unit is a sensor or an actuator and the other communication unit is a digital evaluation or control unit, such as a PLC. Here it is essential that between these two units a unidirectional or bidirectional communication in a half-duplex process is performed, i.e. both units cannot simultaneously exchange information with each other, but only one after the other. For example, the sensor may be a fieldbus device, such as a pressure, temperature, flow or level meter, which is connected to a digital evaluation unit or by a parameterization unit.

In particular, the invention is intended for the tapping of IO-link communication signals. IO-link is a fieldbus independent communication system for connecting intelligent sensors and actuators to an automation system with data transfer rates up to 230 kBaud and is internationally standardized according to the standard IEC61131-9.

To be able to tap these digital communication signals without the need to cut or interrupt the cable a tool is disposed clamp-like around the cable 1. The tool essentially consists of a plurality of electrodes E1-E8 which are uniformly distributed along the inner circumference and arranged side by side. The embodiment comprising eight electrodes illustrated in FIGS. 1a and 1b is only exemplary, and the number of electrodes is arbitrary. More electrodes correspondingly increase the angular resolution. In principle, it is advantageous for the signal evaluation, when more electrodes than conductors are provided. The concrete structural configuration of the tool has been omitted in the representation in FIGS. 1a and 1b, since it has no particular significance for the invention.

The two collector electrodes 10a, 10b are shown respectively by the two dashed arcs. In FIG. 1a the (individual) electrodes E1-E4 are connected to form the first collector electrode 10a and the (individual) electrodes E5-E8 are connected to form the second collector electrode, while in FIG. 1b the (individual) electrodes E1-E3 plus E8 are connected to form the first collector electrode 10a and the (individual) electrodes E4-E7 are connected to form the second collector electrode. It is also conceivable that one collector electrode has five and the other only three individual electrodes, however, a uniform distribution facilitates the signal evaluation. Likewise, it is conceivable that the tapping is implemented only over two preferably opposing individual electrodes while the remaining individual electrodes are connected to ground, or the signals of all opposing individual electrodes are supplied to a number of amplifiers.

Both collector electrodes 10a, 10b are also shown in dashed lines because they are not static, but the allocation of the individual electrodes E1-E8 to both collector electrodes 10a, 10b may be varied, what should be elucidated by the illustrations in FIGS. 1a and 1b. By means of a multiplexer 21—see FIG. 2—or a logic unit 25—see FIG. 3—this constellation is changed until all possible constellations and thus all possible angular positions of the collector electrodes 10a, 10b with respect to the cable 1 have been active once. Once a constellation of individual electrodes is switched active, the amplitudes of the communication signals detected by the respective capacitive coupling are evaluated and stored in an electronic evaluation circuit 20. How this is done in detail will be described with reference to FIGS. 2 and 3. After all constellations were active once, the evaluation circuit 20 knows for which constellation the capacitive coupling of the two collector electrodes 10a, 10b has generated the largest evaluation signal. In exactly this constellation now the communication signal on line 2 can be "wiretapped" continuously over the two collector electrodes 10a, 10b and reconstructed. Here, the capacitance between the two collector electrodes 10a, 10b is about 5 pF.

Figure 2:
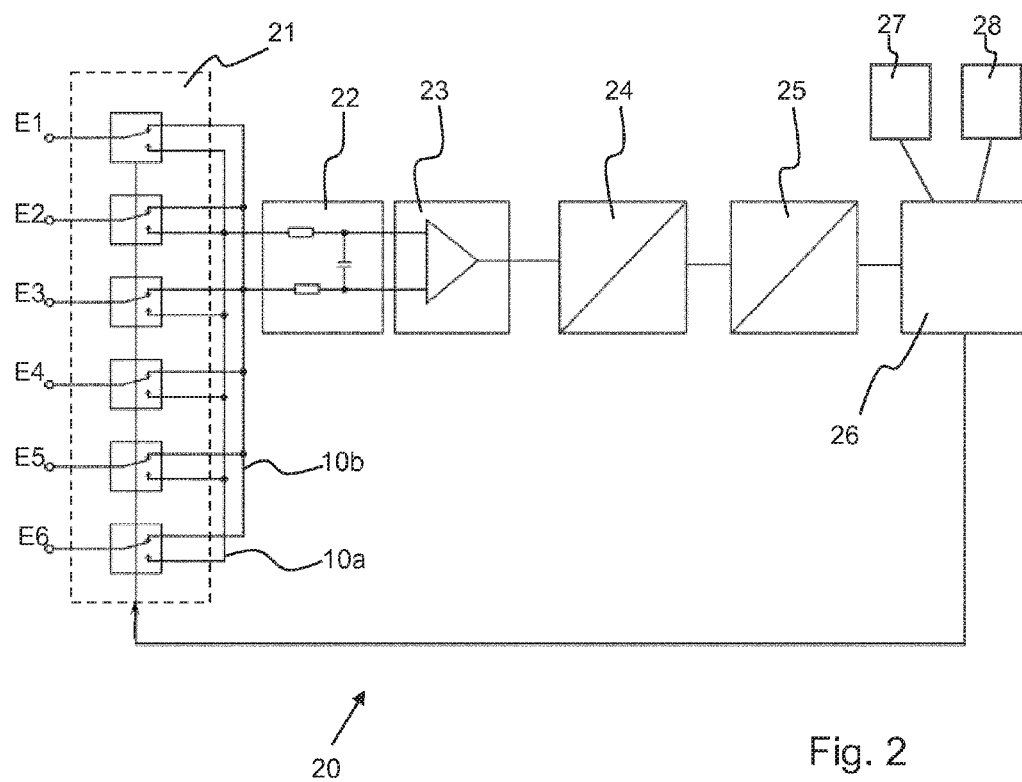
FIG. 2 shows a block diagram of a first exemplary embodiment of a method for contactless tapping of communication signals.

FIG. 2 shows a block diagram of the electronic evaluation circuit 20 of a first exemplary embodiment by means of which the tapping and evaluation of the communication signal is implemented by circuit technology. On the left side, the multiplexer 21 is shown which here comprises six individual electrodes E1-E6. As stated above, the number of electrodes is not limited to eight and six, but is given here only as an example. The multiplexer 21 sets via the switch positions which of the individual electrodes E1-E6 will be connected to the first collector electrode 10a or to the second collector electrode 10b. The multiplexer 21 is controlled by a controller 26 which sequentially changes the allocation of the individual electrodes E1-E6 to the two collector electrodes 10a, 10b until all possible angular positions of the collector electrodes 10a, 10b with respect to the cable have been realized.

The voltage variations of the communication signal by means of the capacitive coupling to the collector electrodes 10a, 10b produce a current signal. In each constellation of the two collector electrodes 10a, 10b these respective current signals are initially supplied to a low pass 22 by means of which, inter alia, higher frequency interference signals can be filtered out—the cut-off frequency is typically 500 kHz—and then supplied to an amplifier 23. The amplifier 23 is advantageously implemented as a differential amplifier in the form of a differential transimpedance amplifier in order to supply a voltage signal which is proportional to the detected current signal to the downstream A/D converter 24. The digitized signal is then reconstructed in a programmable logic 25, for example an FPGA or CPLD module such that the original voltage signal is provided on the signal line 2.

This voltage signal is supplied to the controller 26 in which the respective current signals of the individual constellations of the two collector electrodes 10a, 10b are stored and evaluated. Then depending on the evaluation, the aforementioned control of the multiplexer 21 is implemented by the controller 26. To the controller 26 a display 27 for visually displaying the tapped and reconstructed communication signals and a bus coupler 28 are connected in combination or alternatively via which a connection to a data bus can be established in order to enable forwarding of the tapped and reconstructed communication signals via a bus to a diagnostic unit.

Figure 3:
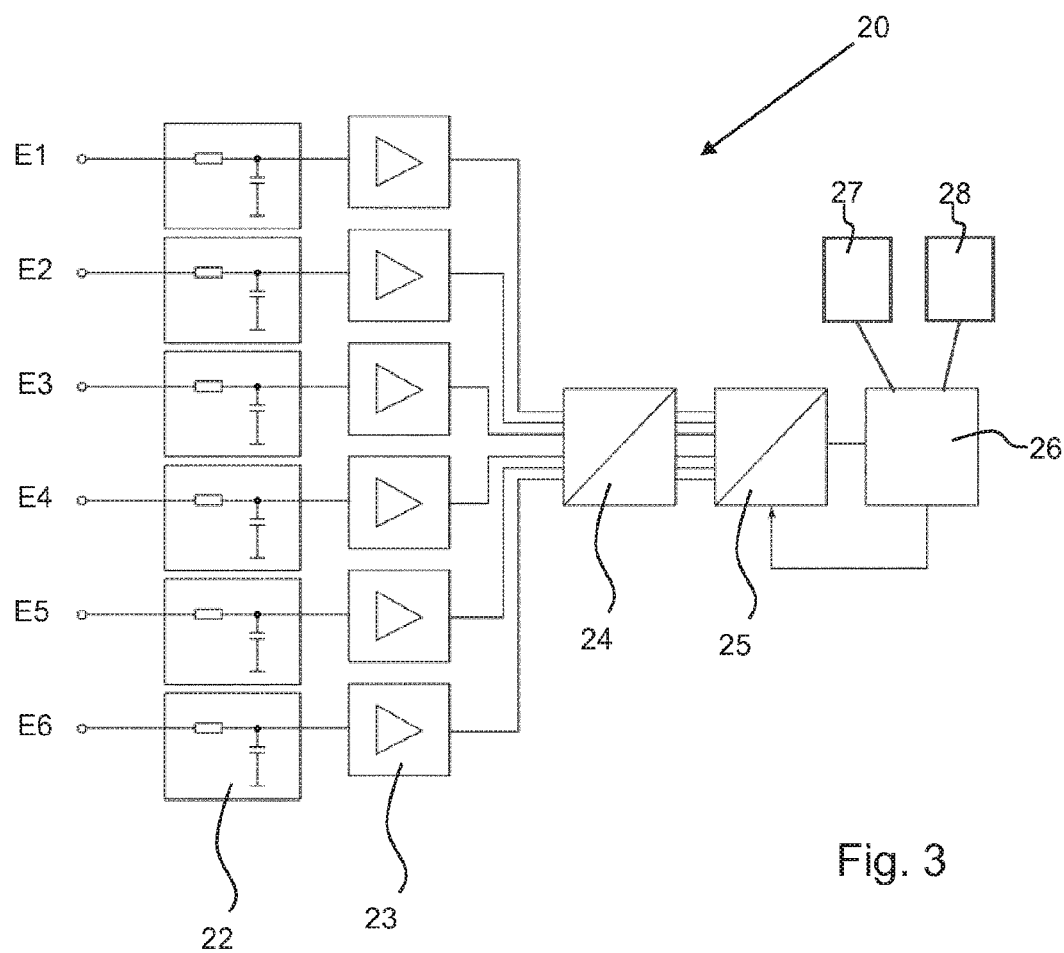
FIG. 3 shows a block diagram of a second exemplary embodiment of the method for contactless tapping of communication signals.

FIG. 3 shows a block diagram of the electronic evaluation circuit 20 of a second exemplary embodiment by means of which tapping and evaluation of the communication signal is realized in an alternative to the embodiment of FIG. 2. Unlike the embodiment shown in FIG. 2 the allocation of the individual electrodes E1-E6 to the at least two collector electrodes 10a, 10b is not implemented already at the beginning of the signal processing but only in a subsequent process step.

The current signals of the individual electrodes E1-E6 are again first supplied to a respective low pass 22 by means of which, inter alia, higher frequency interference signals can be filtered out and then respectively supplied to an amplifier 23. The amplified signals are now supplied to an A/D converter 24 and then supplied in a digitized form to a programmable logic unit 25, for example an FPGA or CPLD module, in which the signals are correlated with each other. The correlation is controlled by a downstream controller 26 and is carried out by addition and/or subtraction logic. Thus, the allocation of the individual electrodes E1-E6 to the collector electrodes is determined so that the logic unit 25 here assumes the function of the multiplexer 21 of FIG. 2. The collector electrodes in this embodiment are not physically visible because their constellation is implemented completely within the logic unit 25 so that in FIG. 3 no numerals are given for this.

In the logic unit 25 the digitized signal resulting from the correlation is reconstructed to the extent that the original voltage signal on the signal line 2 is present at its out-put.

This voltage signal is supplied to the controller 26 in which the respective current signals of the different constellations of the two collector electrodes 10a, 10b are stored and evaluated. Depending on the evaluation then the aforementioned control of the logic unit 25 is implemented by the controller 26 with respect to the correlation. To the controller 26 then a display 27 for a visually displaying the tapped and reconstructed communication signals and a bus coupler 28 are connected in combination or alternatively by means of which a connection to a data bus can be established in order to enable forwarding of the tapped and reconstructed communication signals via a bus to a diagnostic unit.

This embodiment compared to the embodiment including a multiplexer according to FIG. 2 is more complex in circuitry, but more flexible. Thus, in the allocation of the individual electrodes to the collector electrodes 10a, 10b individual electrodes can be excluded so that in view of FIG. 1a and FIG. 1b for the constellation of the collector electrodes 10a, 10b for example only the electrodes E1-E3 and E6-E8 can be used while the electrodes E4 and E5 are not used. This is advantageous when there are electrodes which due to their position relative to the active line do not provide any contribution to the signal. Furthermore, the logic unit 25 can evaluate the correlations of the electrode signals depending on the programming both serially and parallel, while the multiplexer 21 of FIG. 2 is only able to carry out the interconnections serially.

What is claimed is:

1. Method for contactless tapping of communication signals which are exchanged between two communication units including a sensor or an actuator and a digital evaluation or control unit, wherein the communication signals are transmitted as voltage signals on a line of a multi-core cable, comprising the steps of tapping the communication signals capacitively using at least two electrodes on the cable sheathing and whose angular position relative to the cable axis is variable, and wherein that angular position is determined at which the differential signal between both said at least two electrodes is maximum, wherein the at least two electrodes are each formed of a plurality of individual electrodes and configured as collector electrodes and the different angular positions of the collector electrodes are achieved by means of a controller, and wherein the allocation of the individual electrodes to the at least two collector electrodes is sequentially changed.

2. Method according to claim 1, wherein further comprising implementing the change of the allocation of the individual electrodes to the at least two collector electrodes is implemented in a multiplexer to which the individual electrodes are interconnected and which is controlled by the controller.

3. Method according to claim 1, further comprising implementing the change of the allocation of the individual electrodes to the at least two collector electrodes is implemented in a logic unit to which the individual electrodes are interconnected, and which is controlled by the controller.

4. Apparatus for implementing the method according to any one of the preceding claims contactless tapping of communication signals which are exchanged between two communication units including a sensor or an actuator and a digital evaluation or control unit, wherein the communication signals are transmitted as voltage signals on a line of a multi-core cable comprising at least two electrodes to tap the communication signals capacitively, wherein the at least two electrodes are used on the cable sheathing and whose angular position relative to the cable axis is variable, and wherein that angular position is determined at which the differential signal between both said at least two electrodes is maximum, wherein the at least two electrodes are each formed of a plurality of individual electrodes and configured as collector electrodes, and the different angular positions of the collector electrodes to the at least two collector electrodes are achieved by means of a controller, wherein the allocation of the individual electrodes to the at least two collector electrodes is sequentially changed using a clamp-like tool and an electronic evaluation circuit, wherein said tool comprises a plurality of uniformly distributed electrodes arranged side by side along its inner periphery.

5. Apparatus according to claim 4, wherein the communication signals to be tapped are IO-link signals, wherein an IO-link is an independent fieldbus communication system for connecting intelligent sensors.

* * * * *